(12) United States Patent
Chang et al.

(10) Patent No.: US 8,461,049 B2
(45) Date of Patent: Jun. 11, 2013

(54) METHOD FOR FABRICATING SEMICONDUCTOR DEVICE

(75) Inventors: Chu-Chun Chang, Tainan (TW); Chun-Mao Chiou, Chiayi County (TW); Chiu-Te Lee, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/270,229

(22) Filed: Oct. 11, 2011

(65) Prior Publication Data

US 2013/0087837 A1    Apr. 11, 2013

(51) Int. Cl.
*H01L 21/311* (2006.01)

(52) U.S. Cl.
USPC .............. 438/696; 257/407; 257/E21.626; 257/E21.64; 438/183; 438/188; 438/199; 438/595; 438/634; 438/706; 438/740

(58) Field of Classification Search
USPC ............. 257/407, E21.626, E21.64; 438/183, 438/188, 199, 595, 634, 696, 706, 740
See application file for complete search history.

(56) References Cited

U.S. PATENT DOCUMENTS

| 2006/0086987 A1* | 4/2006 | Chen et al. | 257/369 |
| 2010/0052074 A1* | 3/2010 | Lin et al. | 257/407 |

* cited by examiner

*Primary Examiner* — Asok K Sarkar
(74) *Attorney, Agent, or Firm* — Winston Hsu; Scott Margo

(57) ABSTRACT

A method for fabricating semiconductor device is disclosed. The method includes the steps of: providing a substrate having a gate structure thereon; forming a first cap layer on a surface of the substrate and sidewall of the gate structure; forming a second cap layer on the first cap layer; forming a third cap layer on the second cap layer; performing an etching process to partially remove the third cap layer, the second cap layer, and the first cap layer to form a first spacer and a second spacer on the sidewall of the gate structure; and forming a contact etch stop layer (CESL) on the substrate to cover the second spacer, wherein the third cap layer and the CESL comprise same deposition condition.

7 Claims, 7 Drawing Sheets

METHOD FOR FABRICATING SEMICONDUCTOR DEVICE

BACKGROUND OF THE INVENTION

1. Field of the Invention

The invention relates to a method for fabricating a semiconductor device, and more particularly, to a method for fabricating a metal gate CMOS transistor.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

It is an objective of the present invention to provide a method for fabricating metal gate CMOS device with dual work function metal layer.

According to a preferred embodiment of the present invention, a method for fabricating semiconductor device is disclosed. The method includes the steps of: providing a substrate having a gate structure thereon; forming a first cap layer on a surface of the substrate and sidewall of the gate structure; forming a second cap layer on the first cap layer; forming a third cap layer on the second cap layer; performing an etching process to partially remove the third cap layer, the second cap layer, and the first cap layer to form a first spacer and a second spacer on the sidewall of the gate structure; and forming a contact etch stop layer (CESL) on the substrate to cover the second spacer, wherein the third cap layer and the CESL comprise same deposition condition.

It is another aspect of the present invention to provide a semiconductor device. The semiconductor device includes: a substrate; a gate structure disposed on the substrate; a first spacer disposed on a sidewall of the gate structure; a second spacer disposed around the first spacer; a source/drain disposed in the substrate adjacent to two sides of the second spacer; and a CESL disposed on the substrate to cover the gate structure, wherein at least part of the second spacer and the CESL comprise same chemical composition and physical property.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
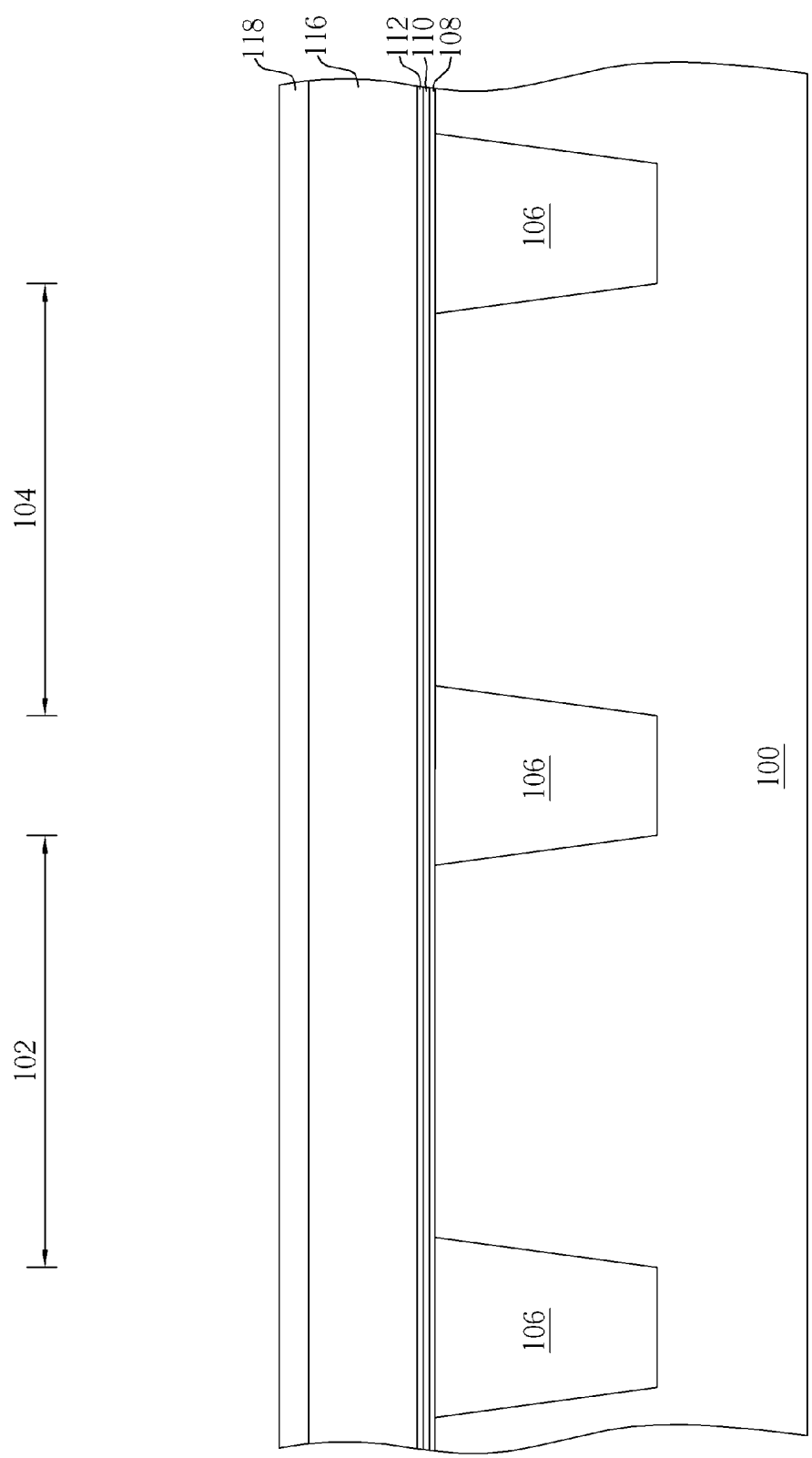
FIGS. 1-7 illustrate a method for fabricating a semiconductor device having metal gate according to a preferred embodiment of the present invention.

Referring to FIGS. 1-6, FIGS. 1-6 illustrate a method for fabricating a semiconductor device having metal gate according to a preferred embodiment of the present invention. In this embodiment, the semiconductor device is preferably a CMOS transistor, in which the method preferably utilizes a gate-last approach accompanying a high-k first fabrication. As shown in FIG. 1, a substrate 100, such as a silicon substrate or a silicon-on-insulator (SOI) substrate is provided. A first region and a second region are defined on the substrate 100, such as a PMOS region 102 and a NMOS region 104. A plurality of shallow trench isolations (STI) 106 are formed in the substrate 100 for separating the two transistor regions.

An interfacial layer 108 composed of dielectric material such as oxides or nitrides is formed on the surface of the substrate 100, and a stacked film composed of a high-k dielectric layer 110, a barrier layer 112, a polysilicon layer 116, and a hard mask 118 is formed on the interfacial layer 108.

In this embodiment, the high-k dielectric layer 110 could be a single-layer or a multi-layer structure containing metal oxide layer such as rare earth metal oxide, in which the dielectric constant of the high-k dielectric layer 110 is substantially greater than 20. For example, the high-k dielectric layer 110 could be selected from a group consisting of hafnium oxide ($HfO_2$), hafnium silicon oxide (HfSiO), hafnium silicon oxynitride (HfSiON), aluminum oxide (AlO), lanthanum oxide ($La_2O_3$), lanthanum aluminum oxide (LaAlO), tantalum oxide, $Ta_2O_3$, zirconium oxide ($ZrO_2$), zirconium silicon oxide (ZrSiO), hafnium zirconium oxide (HfZrO), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). Preferably, the barrier layer 112 is composed of TiN and the metal layer 114 is composed of TaN.

Figure 2:
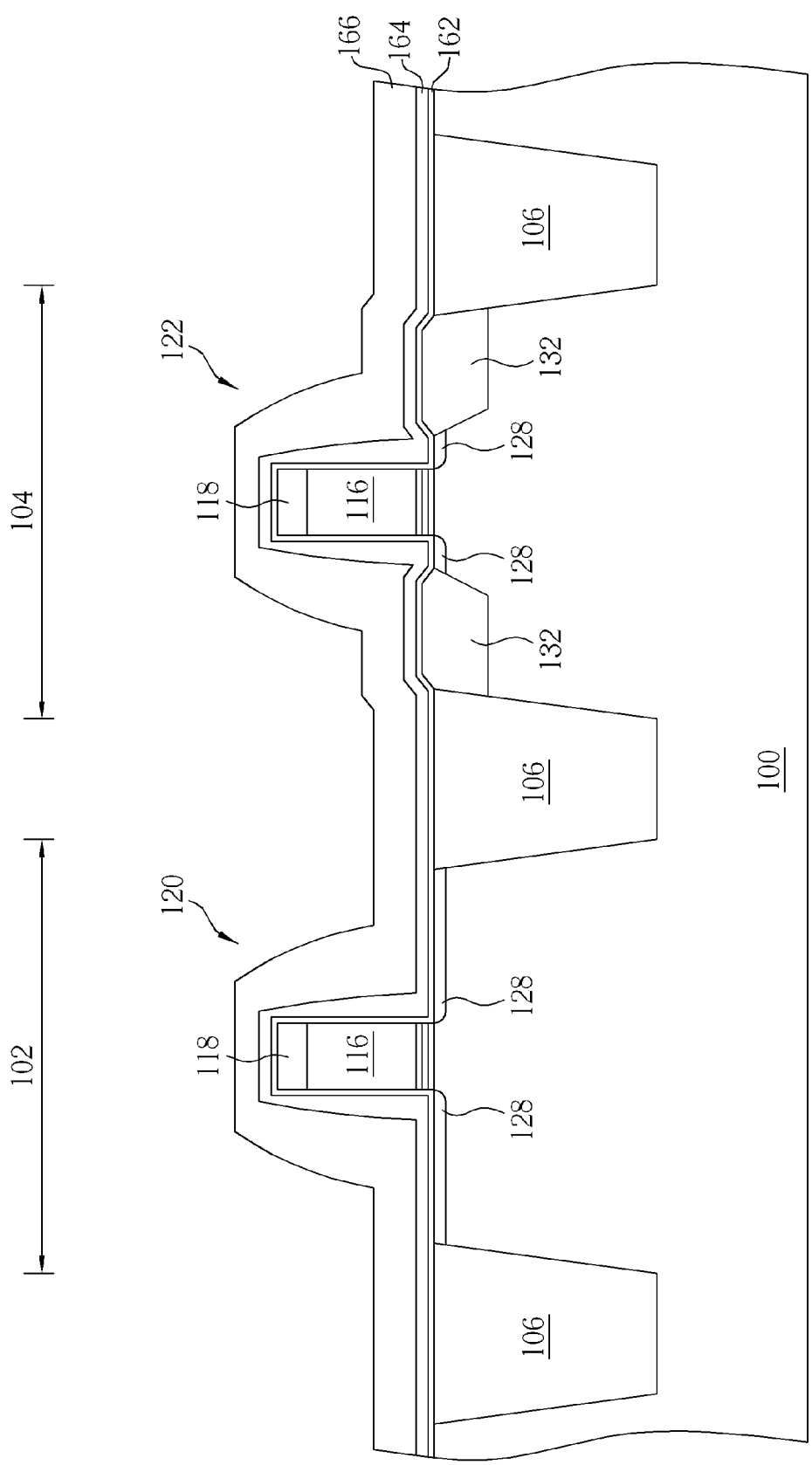

As shown in FIG. 2, a patterned resist (not shown) is formed and a pattern transfer is carried by using the patterned resist as mask to partially remove the hard mask 118, the polysilicon layer 116, the barrier layer 112, the high-k dielectric layer 110, and the interfacial layer 108. After stripping the patterned resist, a first gate structure 120 and a second gate structure 122 serving as dummy gates are formed on the PMOS region 104 and the NMOS region 102 respectively.

Preferably, the polysilicon layer 116 is used as a sacrificial layer, which could be composed of undoped polysilicon, polysilicon having n+ dopants, or amorphous polysilicon material. The hard mask 118 could be composed of $SiO_2$, SiN, SiC, or SiON.

Next, ion implantations are carried out in the PMOS region 104 and the NMOS region 102 to form a lightly doped drain 128 in the substrate 100 adjacent to two sides of the first gate structure 120 and the second gate structure 122.

Next, an offset spacer is formed on the sidewall of the first gate structure 120 and second gate structure 122 and, and a selective epitaxial growth process is carried out on the PMOS and/or NMOS, such as to form an epitaxial layer 132 in the substrate 100 adjacent to two sides of the offset spacer 126 of the PMOS region 104. In this embodiment, the epitaxial layer 132 preferably includes silicon germanium, and the epitaxial layer could be formed by following approaches: selective epitaxial growth process through single or multiple layer approach; SEG process accompanying in-situly doping with progression (such as the most bottom layer with no dopants at all, the first layer with slight dopant, the second layer with dopants of higher concentration, the third layer with dopants of high concentration . . . , and the top layer with no dopants at all or slight dopant concentration); alteration of the concentration of hetero atoms (such as the atom Ge in this case), in which the concentration thereof could be altered according to the constant and surface property of the lattice structure while the surface of the lattice would expect to have a lower concentration of Ge atoms or no Ge atoms at all to facilitate the formation of salicides afterwards.

After selectively removing the offset spacer, a first cap layer 162 is then formed on the substrate 100 to cover the sidewalls of the first gate structure 120 and the second gate structure 122 and the top of the hard mask 118, a second cap layer 164 is formed on the first cap layer 162, and a third cap layer 166 is formed on the surface of the second cap layer 164.

Figure 3:
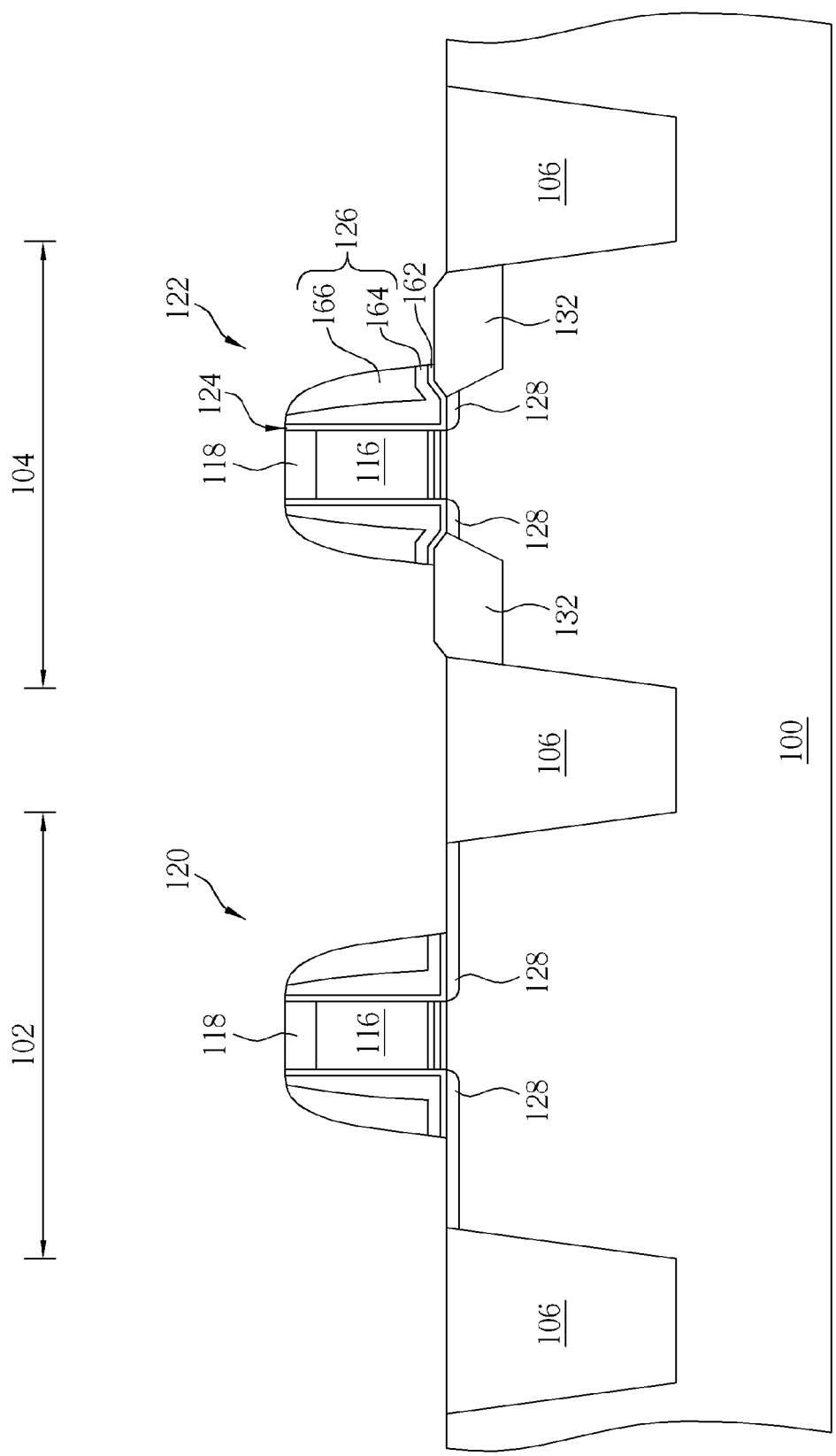

Next, as shown in FIG. 3, an etching process is performed to partially remove the third cap layer 166, the second cap layer 164, and the first cap layer 162 to form a first spacer 124 and a second spacer 126 on the sidewalls of the first gate structure 120 and the second gate structure 122. The first spacer 124 preferably includes a L-shaped first cap layer 162 while the second spacer 126 includes a L-shaped second cap layer 164 and the etched third cap layer 166 sitting on the L-shaped second cap layer 164.

In this embodiment, the first cap layer 162 includes silicon nitride, the second cap layer 164 includes silicon oxide, and the third cap layer 166 includes silicon nitride. The third cap layer 166 preferably has different stress at the PMOS region 104 and the NMOS region 102.

Figure 4:
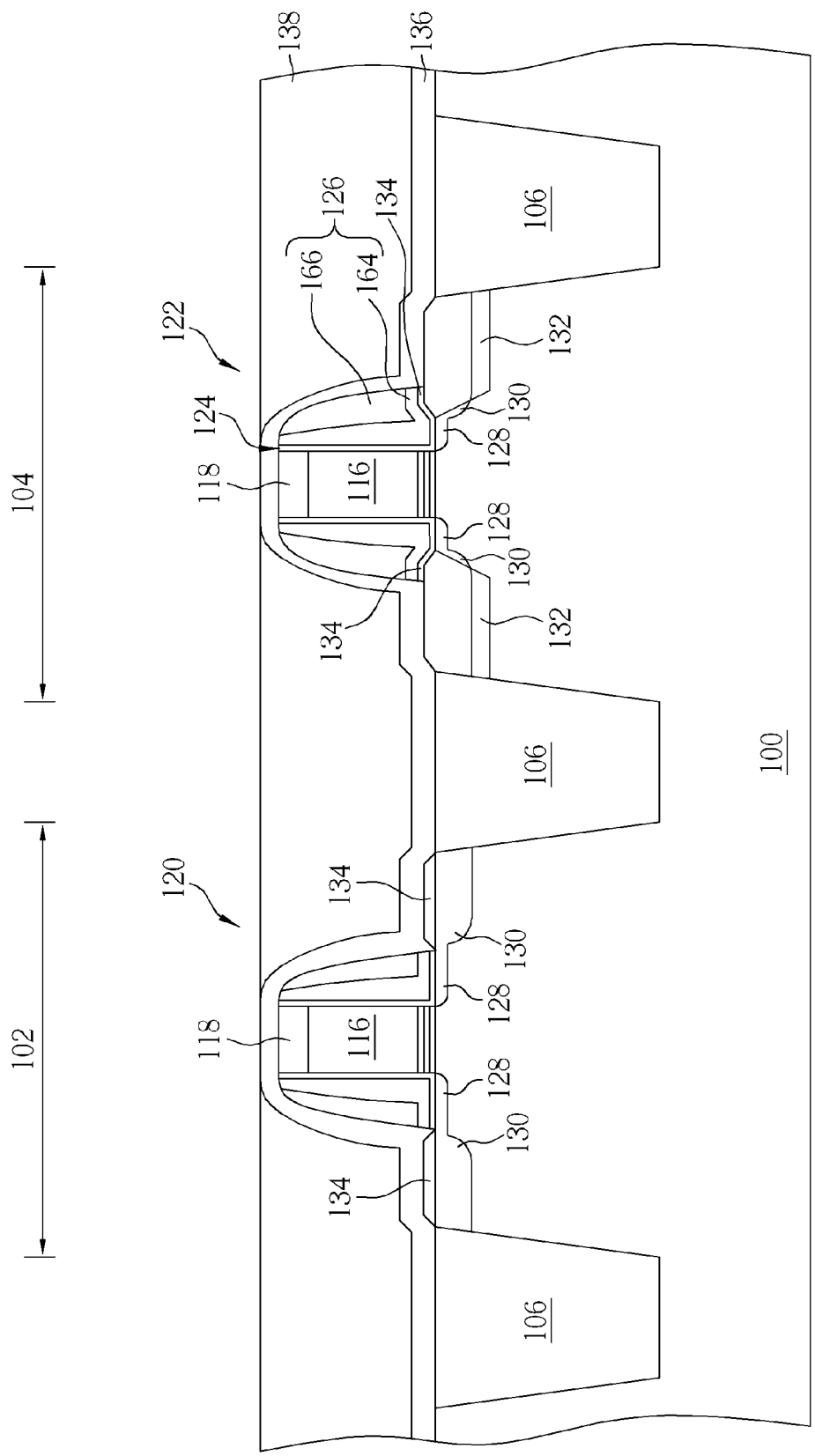

Next, as shown in FIG. 4, ion implantations are carried out in the PMOS region 104 and the NMOS region 102 to form a source/drain 130 in the substrate 100 adjacent to two sides of the first spacer 124 and second spacer 126.

It should be noted that despite the ion implant for the source/drain 130 of the present embodiment is conducted after the formation of the epitaxial layer 132, the ion implant could also be performed before the epitaxial layer 132 is formed or at the same time (in-situly) with the formation of the epitaxial layer 132.

Next, a salicide process is performed by first forming a metal selected from a group consisting of cobalt, titanium, nickel, platinum, palladium, and molybdenum on the epitaxial layer 132 and the source/drain 130, and then using at least one rapid thermal anneal process to react the metal with epitaxial layer 132 and the source/drain 130 for forming a silicide layer 134 on the surface of the epitaxial layer 132 and the source/drain 130 of the NMOS region 102 and the PMOS region 104. The un-reacted metal is removed thereafter.

Next, a CESL 136 is formed on the surface of the substrate 100 to cover the first gate structure 120 and the second spacer 126 of the second gate structure 122, and an interlayer dielectric layer 138 is formed on the substrate 100 to cover both the PMOS region 104 and the NMOS region 102. In this embodiment, the CESL 136 is preferably composed of silicon nitride, which could have different types of stress in corresponding PMOS region 104 and the NMOS region 102. For instance, ion implantations or thermal treatments (such as UV) could be carried out to adjust the third cap layer 166 in the second spacers 126 as well as the CESL 136 in both PMOS region 104 and NMOS region 102. The interlayer dielectric layer 138 is composed of silicon oxide and the thickness thereof is between 1500-5000 Angstroms and preferably at about 3000 Angstroms. Moreover, according to a preferred embodiment of the present invention, the third cap layer 166 and the CESL 136 are preferably formed with same deposition parameters, such as having same deposition pressure, deposition temperature, types of precursor, flow rate of the carrier gas and reacting gas, and/or bias power and RF power. The thicknesses of these two layers however are different, and due to their different thickness, the two layers also have substantially different stress. As the two layers 166 and 136 are deposited with same parameters, the chemical composition and/or physical property of at least part of the first spacer 124 and second spacer 126 are identical to those of the CESL 136, such as the two layers have same bond ratio, impurity content, and/or density. Taking silicon nitride used in CESL as an example, impurity include hydrogen and the impurity content is preferably the atomic percent of hydrogen in silicon nitride; the bond ratio is preferably the ratio between Si—N bond and N—H bond. The third cap layer 166 and the CESL 136 preferably have same bond ratio, impurity content, or density, or the third cap layer 166 and the CESL 136 have same bond ratio, impurity content, and density.

A planarizing process, such as a chemical mechanical polishing process is then performed to partially remove the interlayer dielectric layer 138 until exposing the surface of the CESL 136.

Figure 5:
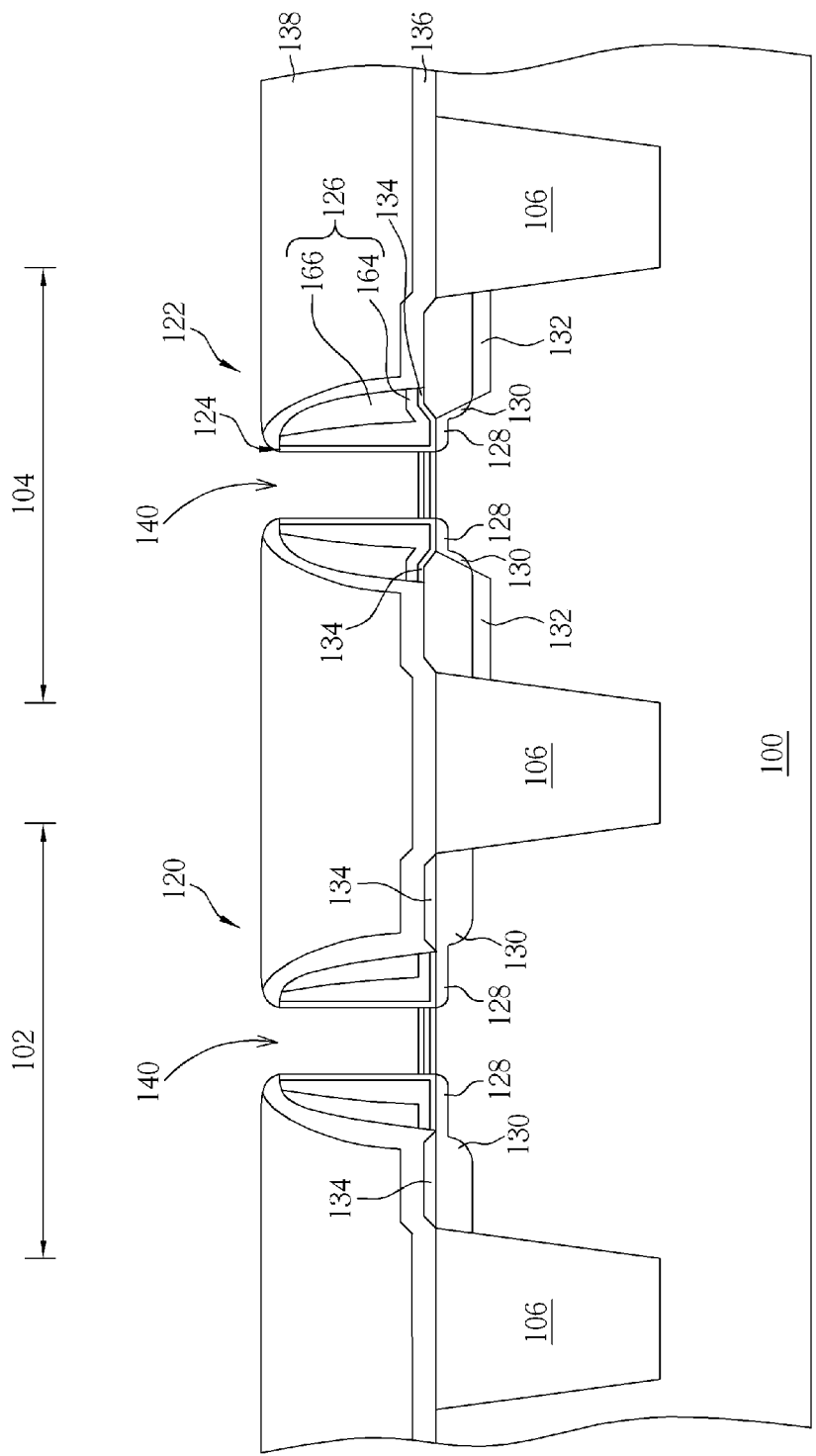

Next, as shown in FIG. 5, the CESL 136 and the hard mask 118 are etched away, and another etching process is carried out to remove the polysilicon layer 116 from both PMOS region 104 and NMOS region 102 to form a recess 140 in each region. It should be noted that despite the polysilicon layer 116 is removed from both regions simultaneously, the present invention could also remove the polysilicon layer from one of the two regions and deposit metal into the recess, and then remove polysilicon layer from the other region and deposit metal in thereafter.

Figure 6:
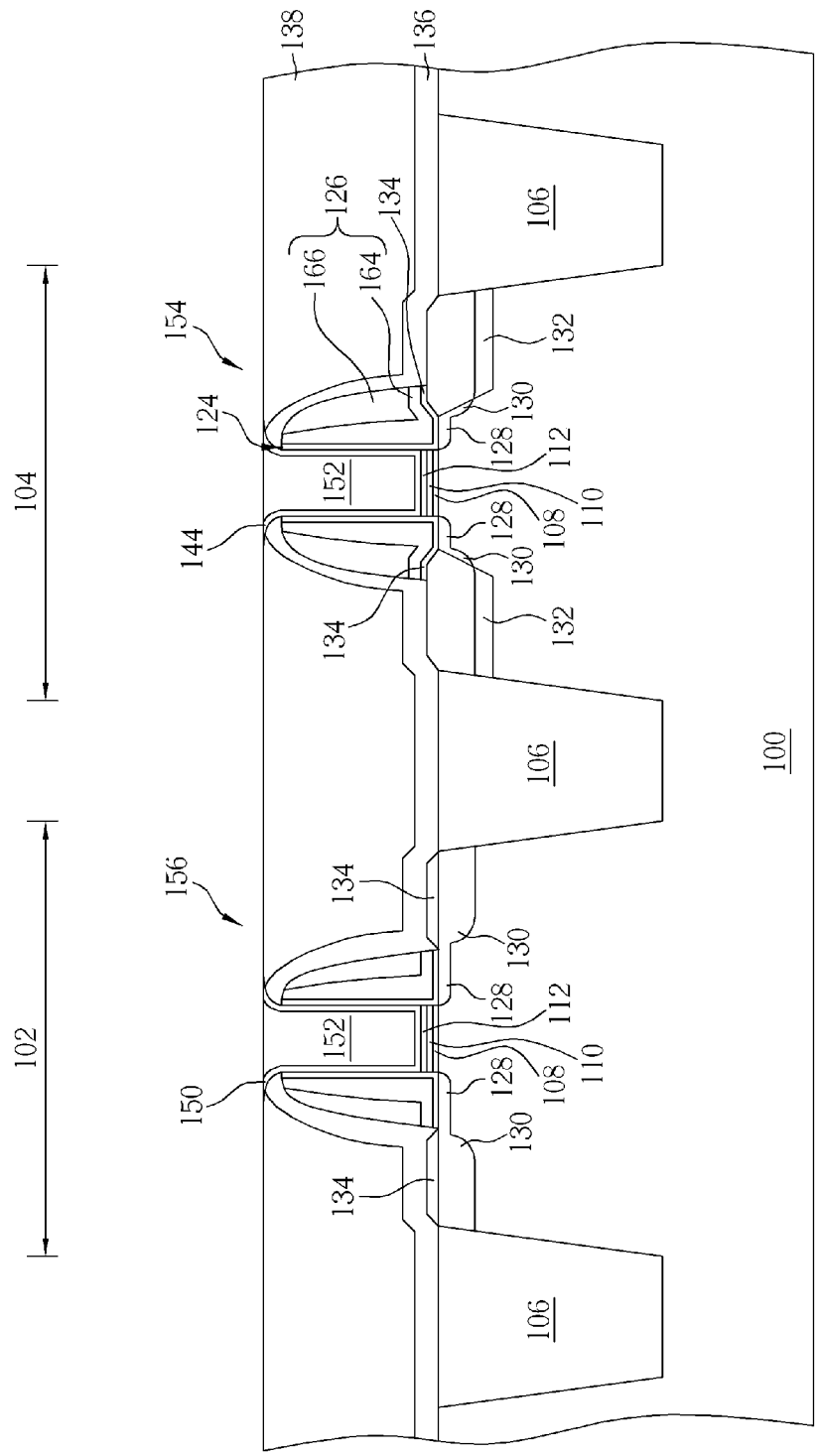

Next, as shown in FIG. 6, a work function metal layer and a conductive layer 152 with low resistance are deposited to fill the recess 140.

Next, one or multiple planarizing process, such as chemical mechanical polishing process is performed on both NMOS and PMOS to partially remove the conductive layer 152 and work function metal layer to form a first metal gate 154 and second metal gate 156 in the PMOS region 102 and NMOS region 104 respectively. It should be noted that as the present invention pertains to a CMOS device having dual work function metal layers, the fabrication of the work function metal layer 144 in the PMOS region 104 and work function metal layer 150 in the NMOS region 102 are preferably separated. As this approach is well known to those skilled in the art, the details of which is omitted herein for the sake of brevity. Moreover, the aforementioned layers formed in the N/P MOS region could be different according to the demand of the product.

In this embodiment, the p-type work function metal layer 144 is selected from a group consisting of TiN and TaC, but not limited thereto. The n-type work function metal layer 150 is selected from a group consisting of TiAl, ZrAl, WAl, TaAl, and HfAl, but not limited thereto. The conductive layer 152 is selected from a group consisting of Al, Ti, Ta, W, Nb, Mo, Cu, TiN, TiC, TaN, Ti/W, and composite metal such as Ti/TiN, but not limited thereto.

Figure 7:
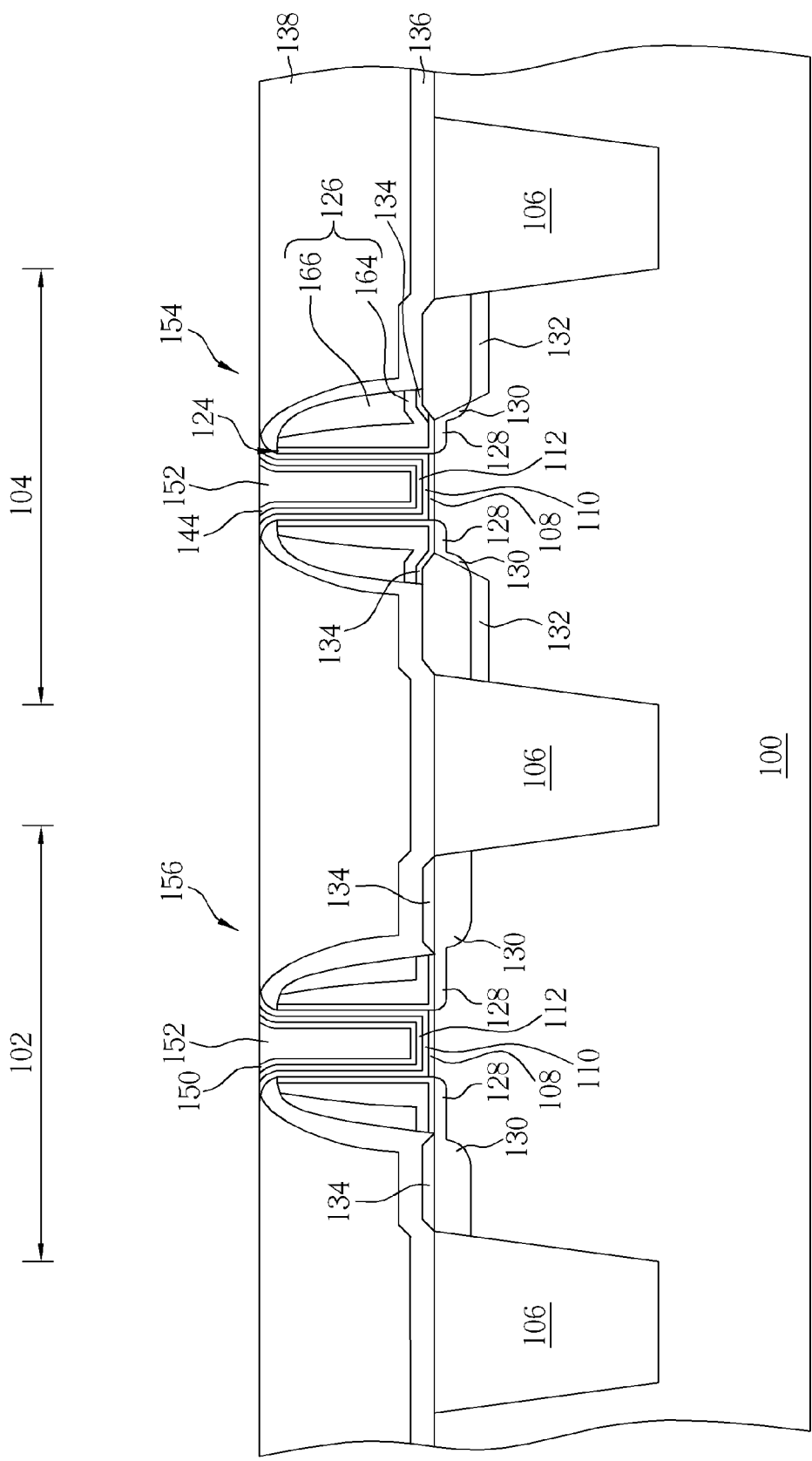

It should be noted that despite the aforementioned embodiment applies to a high-k first process, the present invention could also be applied to a high-k last process. For instance, as shown in FIG. 7, a dummy gate of FIG. 3 could be first formed on a substrate 100, in which the dummy gate only includes an interfacial layer, a polysilicon layer, and a hard mask. Next, following the process carried out from FIG. 4, a first spacer 124 and a second spacer 126 are formed around the dummy gate, a lightly doped drain 128 and a source/drain 130 are formed in the substrate 100 adjacent to two sides of the first spacer 124 and second spacer 126, a CESL 136 and an interlayer dielectric layer 138 are formed on the dummy gate and the substrate 100, a planarizing process is performed to partially remove the CESL 136 and the interlayer dielectric layer 138, and the polysilicon layer is removed from the dummy gate. Next, a high-k dielectric fabrication could be performed, as shown in FIG. 7, to sequentially form a high-k dielectric layer 110 and a barrier layer 112 in the recess of the PMOS region 104 and NMOS region 102, a n-type work function metal layer 150 and a p-type work function metal layer 144 are formed in the NMOS region 102 and PMOS region 104 respectively, a conductive layer 152 with low resistivity is formed on the p-type work function metal layer 144 and n-type work function metal layer 150 to fill the recess 140, and another planarizing process is performed to form metal gates 154 and 156 in the NMOS region 102 and PMOS region 104.

As conventional approach of performing a thinning process on the second spacer to partially remove the outer silicon nitride of the second spacer after the formation of gate structure and source/drain typically results in issues such as silicon nitride loading and/or silicide loss, the present invention preferably deposits a cap layer composed of silicon oxide and a CESL composed of silicon nitride and then partially etching these two layers to form a second spacer. As part of the second spacer is composed of CESL, the present invention could reduce the overall thickness of another CESL deposited on the entire substrate thereafter while eliminating the need for thinning the second spacer, and also improving issues such as silicon nitride loading and silicide loss.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a gate structure thereon;
    forming a first cap layer on a surface of the substrate and sidewall of the gate structure;
    forming a second cap layer on the first cap layer;
    forming a third cap layer on the second cap layer;
    performing an etching process to partially remove the third cap layer, the second cap layer, and the first cap layer to form a first spacer and a second spacer on the sidewall of the gate structure; and
    forming a contact etch stop layer (CESL) on the substrate to cover the second spacer, wherein the third cap layer and the CESL comprise same deposition parameters.

2. The method of claim 1, wherein the first cap layer comprises silicon nitride.

3. The method of claim 1, wherein the second cap layer comprises silicon oxide.

4. The method of claim 1, wherein the third cap layer comprises silicon nitride.

5. The method of claim 1, wherein the gate structure comprises a high-k dielectric layer and a polysilicon layer.

6. The method of claim 1, wherein the deposition parameters comprise precursor, carrier gas, pressure, and process power.

7. The method of claim 1, wherein after forming the first spacer and the second spacer further comprises:
    forming a source/drain in the substrate adjacent to two sides of the second spacer;
    forming a dielectric layer on the CESL;
    using a first planarizing process to partially remove the dielectric layer such that the surface of the gate structure is even with the surface of the dielectric layer;
    forming a recess in the gate structure;
    forming a work function metal layer in the recess;
    forming a conductive layer on the work function metal layer to fill the recess; and
    performing a second planarizing process to form a metal gate.

* * * * *